United States Patent
Qin et al.

(10) Patent No.: US 12,231,129 B2
(45) Date of Patent: Feb. 18, 2025

(54) SIGNAL GENERATOR AND MEMORY

(71) Applicant: CHANGXIN MEMORY TECHNOLOGIES, INC., Hefei (CN)

(72) Inventors: Jianyong Qin, Hefei (CN); Jianni Li, Hefei (CN); Zhonglai Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 244 days.

(21) Appl. No.: 17/937,404

(22) Filed: Sep. 30, 2022

(65) Prior Publication Data

US 2023/0026826 A1    Jan. 26, 2023

Related U.S. Application Data

(63) Continuation of application No. PCT/CN2022/093713, filed on May 19, 2022.

(30) Foreign Application Priority Data

Apr. 26, 2022 (CN) .......................... 202210451913.X

(51) Int. Cl.
G11C 11/40 (2006.01)
G11C 11/4076 (2006.01)
(Continued)

(52) U.S. Cl.
CPC ........ H03K 5/1565 (2013.01); G11C 11/4076 (2013.01); G11C 29/56012 (2013.01); H03K 3/0315 (2013.01)

(58) Field of Classification Search
CPC ...... H03K 5/1565; H03K 3/0315; H03K 5/02; G11C 11/4076; G11C 29/56012; G11C 7/222; G11C 29/023; G11C 29/028
See application file for complete search history.

(56) References Cited

U.S. PATENT DOCUMENTS 6,671,652 B2   12/2003   Watson, Jr.
6,721,114 B1   4/2004    Sutardja
(Continued)

FOREIGN PATENT DOCUMENTS

CN   1416215 A    5/2003
CN   1677820 A    10/2005
(Continued)

OTHER PUBLICATIONS

JEDEC JESD209-4B, Low Power Double Data Rate 4 (LPDDR4), JEDEC Solid State Technology Association, Feb. 2017.
(Continued)

*Primary Examiner* — Mohammed A Bashar
(74) *Attorney, Agent, or Firm* — Syncoda LLC; Feng Ma

(57) ABSTRACT

The signal generator includes the following: an oscillation generation circuit, configured to generate an initial oscillation signal based on an oscillation control signal; a duty cycle correction circuit, connected to an output end of the oscillation generation circuit and configured to adjust a duty cycle of the initial oscillation signal based on a duty cycle control signal, to generate an adjusted oscillation signal; an output interface, connected to an output end of the duty cycle correction circuit and configured to output the adjusted oscillation signal to an external test system; and an amplitude adjustment circuit, connected to the output end of the duty cycle correction circuit and configured to adjust an amplitude of the adjusted oscillation signal based on an amplitude control signal, to generate a test signal.

18 Claims, 8 Drawing Sheets

(51) Int. Cl.
*G11C 29/56* (2006.01)
*H03K 3/03* (2006.01)
*H03K 5/156* (2006.01)

(56) References Cited

U.S. PATENT DOCUMENTS

| | | | |
|---|---|---|---|
| 6,927,641 | B2 | 8/2005 | Terasawa |
| 7,567,118 | B2 | 7/2009 | Azuma |
| 9,448,274 | B2 | 9/2016 | Pounds |
| 10,164,572 | B2 | 12/2018 | Chen |
| 10,885,989 | B1 | 1/2021 | Moon |
| 11,005,479 | B2 | 5/2021 | Im |
| 11,349,457 | B2 | 5/2022 | Kim |
| 11,496,136 | B1 | 11/2022 | Park |
| 2002/0136326 | A1* | 9/2002 | Underbrink ............. H03F 3/217 375/308 |
| 2003/0020529 | A1 | 1/2003 | Nakanishi |
| 2003/0098749 | A1 | 5/2003 | Terasawa |
| 2003/0219089 | A1 | 11/2003 | Ho |
| 2005/0094448 | A1 | 5/2005 | Lee |
| 2005/0218966 | A1 | 10/2005 | Azuma |
| 2007/0223638 | A1 | 9/2007 | Okamura |
| 2008/0005606 | A1 | 1/2008 | Koo |
| 2011/0156757 | A1 | 6/2011 | Hayashi |
| 2011/0181308 | A1 | 7/2011 | Ishida |
| 2013/0010851 | A1* | 1/2013 | Jaeger ................ H04B 17/0085 375/224 |
| 2015/0301104 | A1 | 10/2015 | Pounds et al. |
| 2017/0222796 | A1 | 8/2017 | Chen et al. |
| 2017/0230018 | A1* | 8/2017 | Hwang .................... H04B 1/16 |
| 2018/0054163 | A1 | 2/2018 | Chen et al. |
| 2019/0181847 | A1 | 6/2019 | Satoh et al. |
| 2020/0336148 | A1 | 10/2020 | Im et al. |
| 2021/0336526 | A1* | 10/2021 | Ayati .................... H03F 3/2173 |
| 2022/0094339 | A1 | 3/2022 | Kim et al. |
| 2022/0130439 | A1 | 4/2022 | Tian et al. |
| 2022/0247390 | A1 | 8/2022 | Kim et al. |

FOREIGN PATENT DOCUMENTS

| | | |
|---|---|---|
| CN | 101826860 A | 9/2010 |
| CN | 101410719 B | 1/2012 |
| CN | 102638247 A | 8/2012 |
| CN | 103840796 A | 6/2014 |
| CN | 103997317 A | 8/2014 |
| CN | 104753524 A | 7/2015 |
| CN | 106233150 A | 12/2016 |
| CN | 107153138 A | 9/2017 |
| CN | 109274356 A | 1/2019 |
| CN | 209087409 U | 7/2019 |
| CN | 111161771 A | 5/2020 |
| CN | 111193498 A | 5/2020 |
| CN | 210899108 U | 6/2020 |
| CN | 111835349 A | 10/2020 |
| CN | 111863048 A | 10/2020 |
| CN | 112420113 A | 2/2021 |
| CN | 113346739 A | 9/2021 |
| CN | 113764028 A | 12/2021 |
| CN | 215773547 U | 2/2022 |
| CN | 114257235 A | 3/2022 |
| CN | 114420187 A | 4/2022 |
| EP | 3886099 A1 | 9/2021 |
| WO | 2015037252 A1 | 3/2015 |

OTHER PUBLICATIONS

Jedec JESD209-5B, Low Power Double Data Rate 5 (LPDDR5), JEDEC Solid State Technology Association, Jun. 2021.

Kyu-hyoun kim, A 20-Gb/s 256-Mb DRAM with an Inductorless Quadrature PLL and a Cascaded Pre-emphasis Transmitter, JSSC, Jan. 2006.

Non-Final Office Action of the U.S. Appl. No. 17/866,682, issued on Jan. 17, 2023.

* cited by examiner

SIGNAL GENERATOR AND MEMORY

CROSS-REFERENCE TO RELATED APPLICATIONS

This is a continuation of International Patent Application No. PCT/CN2022/093713 filed on May 19, 2022, which claims priority to Chinese Patent Application No. 202210451913.X filed on Apr. 26, 2022. The disclosures of the above-referenced applications are hereby incorporated by reference in their entirety.

BACKGROUND

With progress of technology, high-tech products are constantly updated and performance of the products is constantly improved, and the work of high-tech products is inseparable from storage of data by a memory. Therefore, it is an urgent problem to improve data access rate and data access stability of the memory at present.

A clock signal is used in data processing by the memory, and transmission frequency of the clock signal determines the number of operations performed by the memory within the same time, that is, a speed of the data processing performed by the memory is determined. That is to say, the data processing performed by the memory based on a high-speed clock signal is of great significance to improve the performance of the memory.

The urgent problems to be solved at present are how to test whether a duty cycle of the high-speed clock signal satisfies requirements, how to ensure accuracy of the high-speed clock signal test, and how to generate equidistant parallel clock signals based on the high-speed clock signal.

SUMMARY

The present disclosure relates to the field of semiconductor circuit design, and in particular, to a signal generator and a memory.

The embodiments of the present disclosure provide a signal generator, which includes an oscillation generation circuit, a duty cycle correction circuit, an output interface and an amplitude adjustment circuit. The oscillation generation circuit is configured to generate an initial oscillation signal based on an oscillation control signal, and the oscillation control signal is used for adjusting a frequency of the generated initial oscillation signal. The duty cycle correction circuit is connected to an output end of the oscillation generation circuit and configured to adjust a duty cycle of the initial oscillation signal based on a duty cycle control signal, to generate an adjusted oscillation signal. The output interface is connected to an output end of the duty cycle correction circuit and configured to output the adjusted oscillation signal to an external test system, and the external test system is configured to test whether the adjusted oscillation signal satisfies a preset condition. The amplitude adjustment circuit is connected to the output end of the duty cycle correction circuit and configured to adjust an amplitude of the adjusted oscillation signal based on an amplitude control signal, to generate a test signal.

The embodiments of the present disclosure also provide a memory. The memory may be configured for generating a test signal having a duty cycle satisfying a preset condition based on the signal generator according to the above embodiments.

BRIEF DESCRIPTION OF THE DRAWINGS

One or more embodiments are exemplified by the figures in the corresponding drawings, and these exemplary descriptions do not constitute limitations of the embodiments. Unless otherwise stated, the figures in the drawings do not constitute a scale limitation. In order to illustrate the technical solutions in the embodiments of the disclosure or conventional technologies more clearly, the drawings used in the embodiments will be briefly described below. It is apparent that the drawings in the following descriptions are merely some embodiments of the disclosure. Other drawings can be obtained from those of ordinary skill in the art according to these drawings without any creative work.

DETAILED DESCRIPTION

The urgent problems to be solved at present are how to test whether a duty cycle of the high-speed clock signal satisfies requirements, how to ensure accuracy of the high-speed clock signal test, and how to generate equidistant parallel clock signals based on the high-speed clock signal.

The embodiments of the present disclosure provide a signal generator and a memory to generate a high-speed clock signal having a duty cycle that satisfies memory requirements.

It is to be understood by those of ordinary skill in the art that, in each embodiment of the present disclosure, many technical details are provided to better understand the disclosure. However, the technical solutions claimed in the disclosure may also be implemented even without these technical details and various changes and modifications based on the following embodiments. The following divisions of the embodiments are for ease of description, and should not constitute any limitation to the specific implementations of the disclosure. The embodiments may be combined with each other and referred to each other without contradiction.

Figure 1:
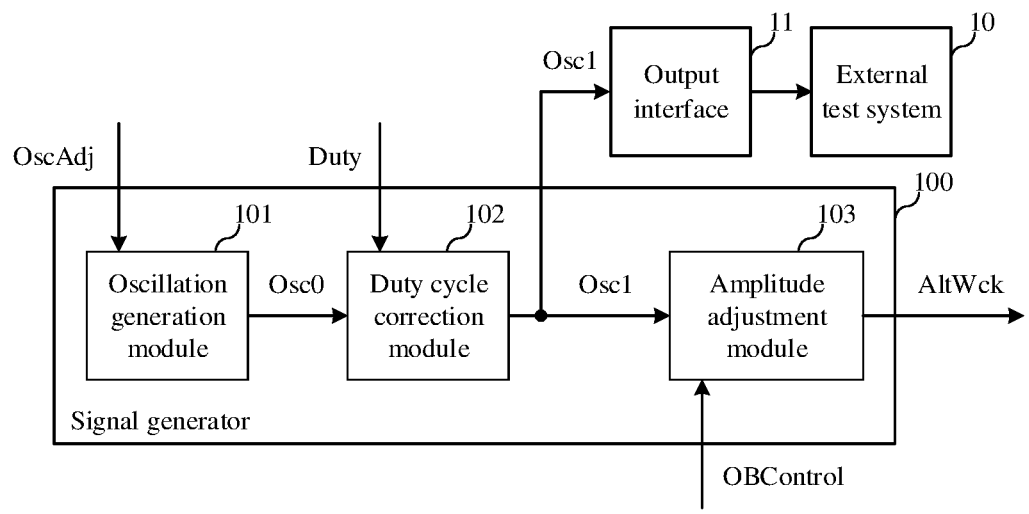
FIG. 1 is a schematic structural diagram of a signal generator according to an embodiment of the present disclosure.
Figure 2:
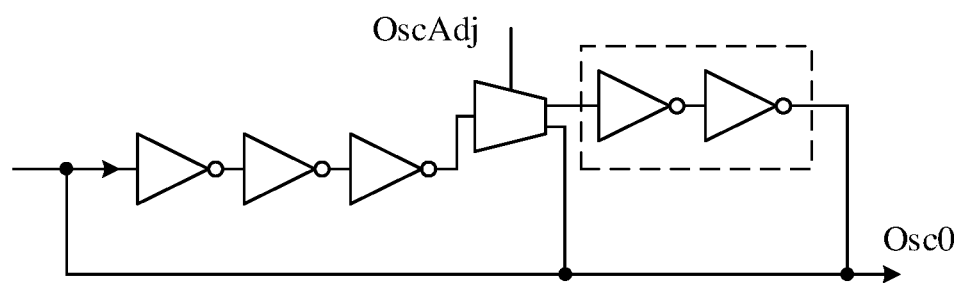
FIG. 2 is a schematic structural diagram of a ring oscillator according to an embodiment of the present disclosure.
Figure 3:
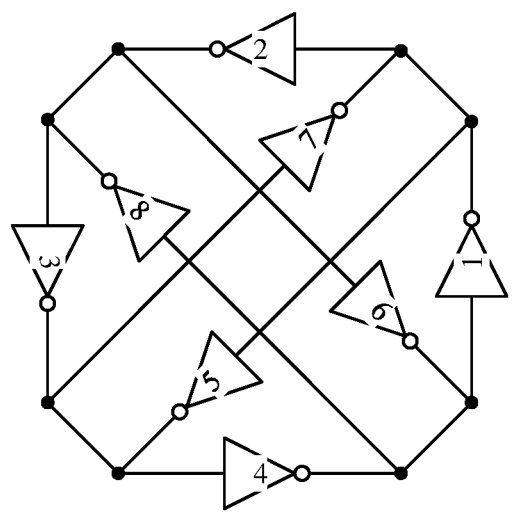
FIG. 3 is a schematic structural diagram of a tetrahedral oscillator according to an embodiment of the present disclosure.
Figure 4:
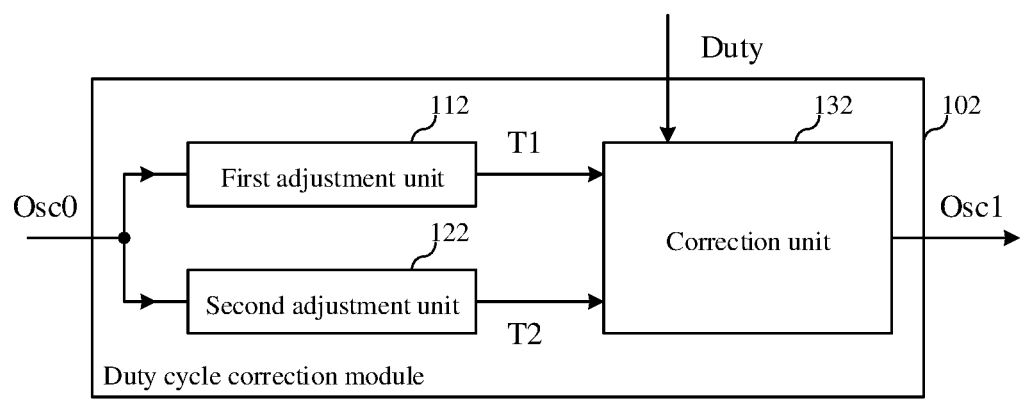
FIG. 4 is a schematic structural diagram of a duty cycle correction circuit according to an embodiment of the present disclosure.
Figure 5:
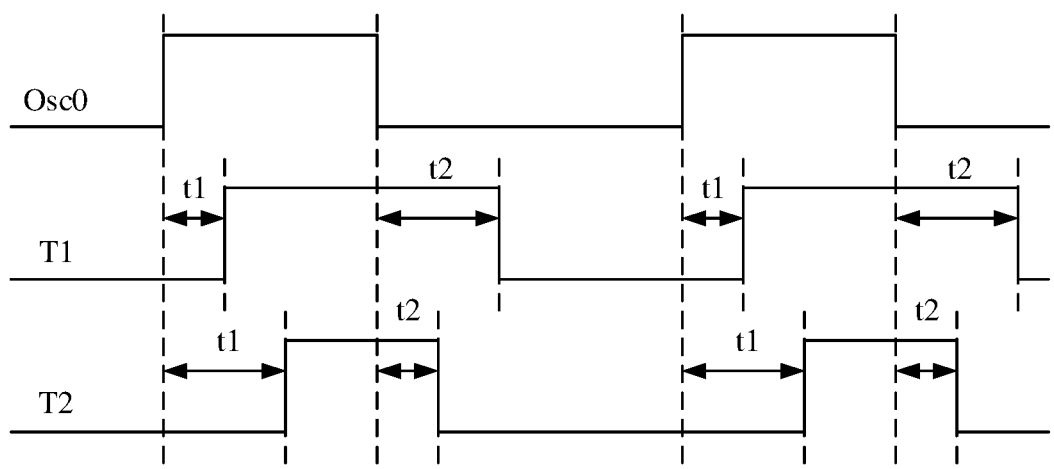
FIG. 5 is a schematic diagram of correction principles of a first adjustment circuit and a second adjustment circuit according to an embodiment of the present disclosure.
Figure 6:
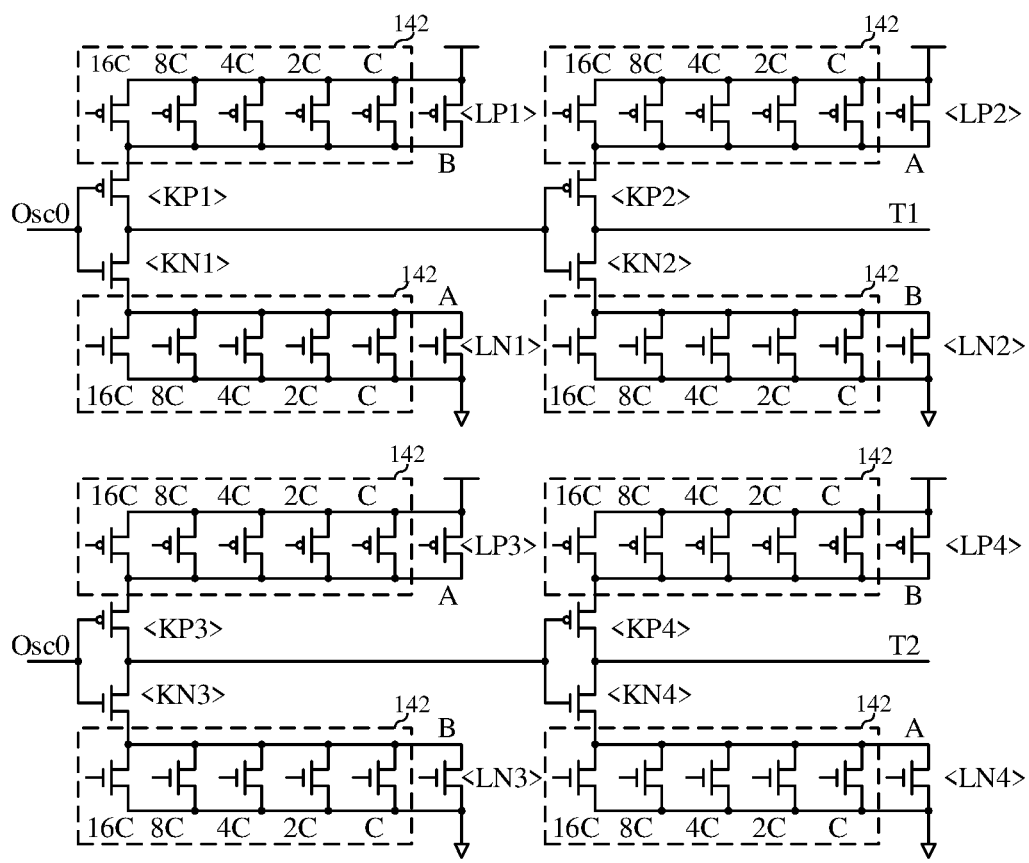
FIG. 6 is a schematic structural diagram of a first adjustment circuit and a second adjustment circuit according to an embodiment of the present disclosure.
Figure 7:
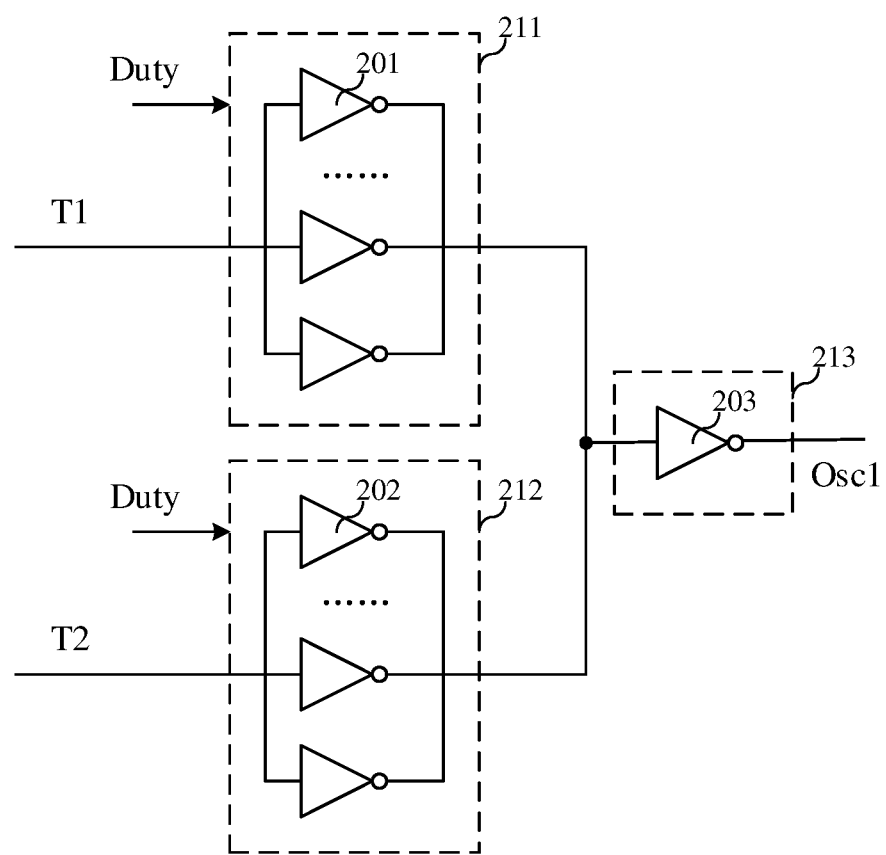
FIG. 7 is a schematic structural diagram of a correction circuit according to an embodiment of the present disclosure.
Figure 8:
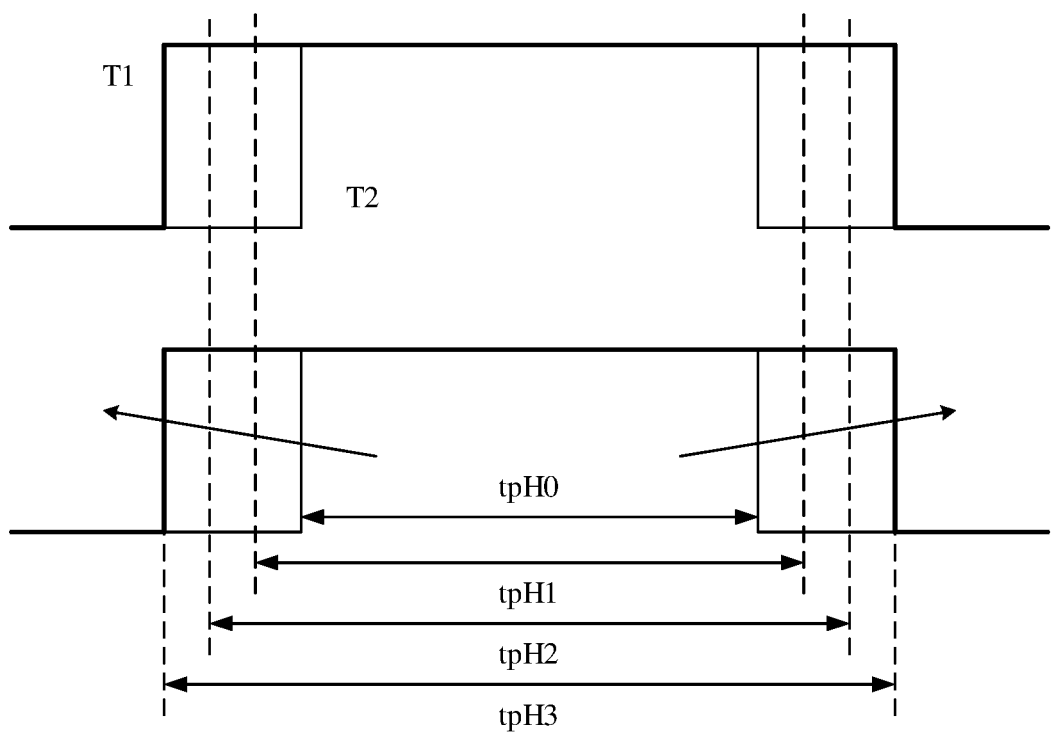
FIG. 8 is a schematic diagram of a correction principle of a correction circuit according to an embodiment of the present disclosure.
Figure 9:
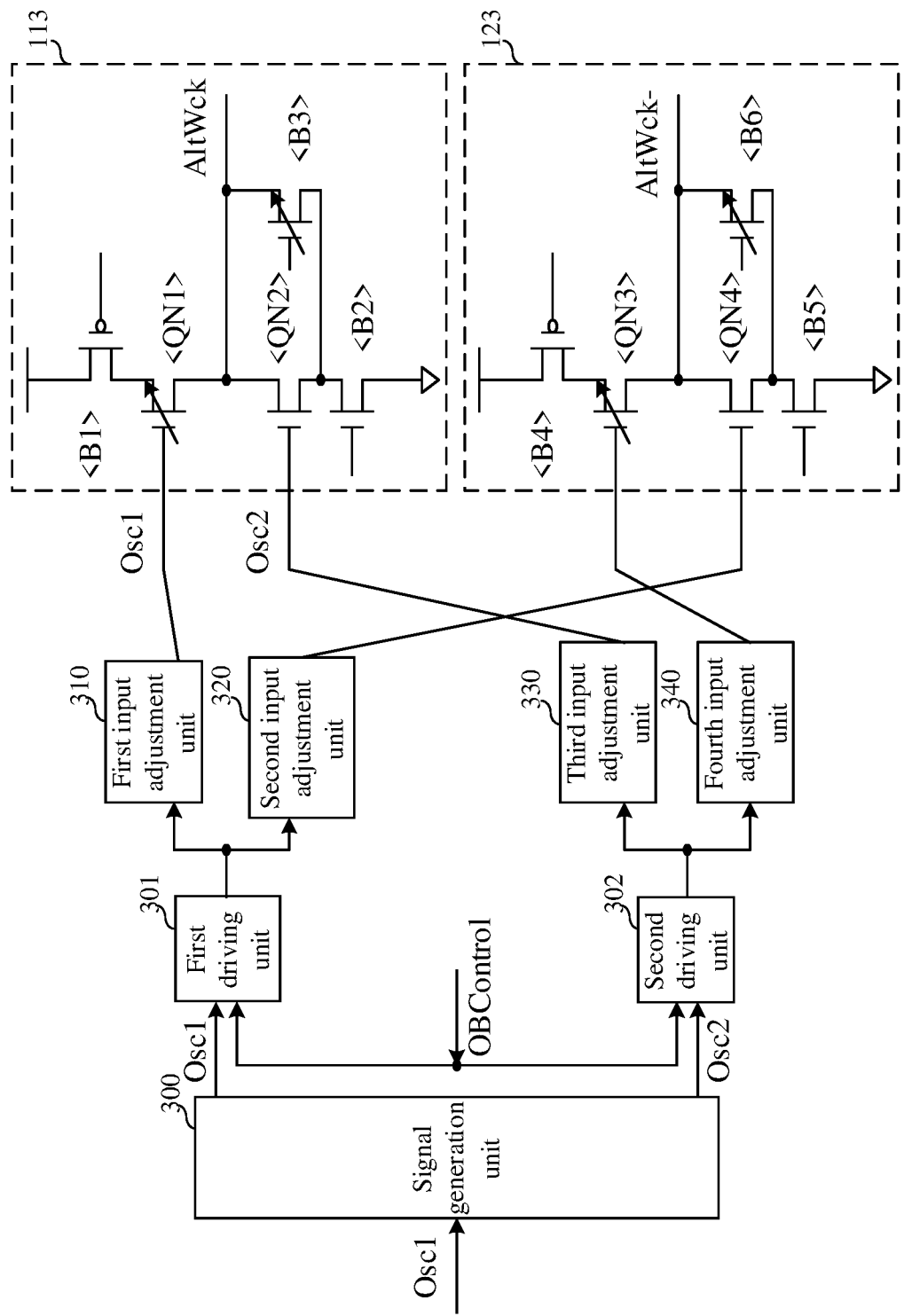
FIG. 9 is a schematic structural diagram of an amplitude adjustment circuit according to an embodiment of the present disclosure.
Figure 10:
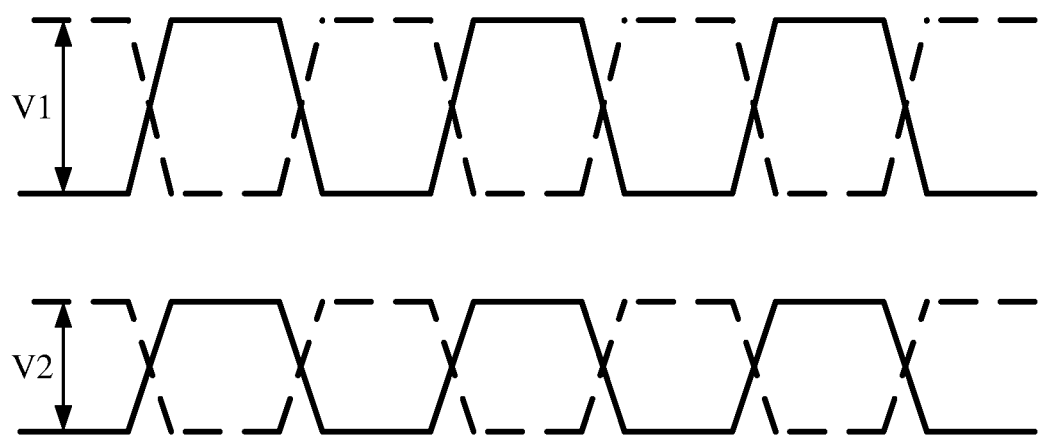
FIG. 10 is a schematic diagram of an adjustment principle of an amplitude adjustment circuit according to an embodiment of the present disclosure.

FIG. 1 is a schematic structural diagram of a signal generator according to an embodiment. FIG. 2 is a schematic structural diagram of a ring oscillator according to an embodiment. FIG. 3 is a structural schematic diagram of a tetrahedral oscillator according to an embodiment. FIG. 4 is a schematic structural diagram of a duty cycle correction circuit according to an embodiment. FIG. 5 is a schematic diagram of correction principles of a first adjustment circuit and a second adjustment circuit according to an embodiment. FIG. 6 is a schematic structural diagram of a first adjustment circuit and a second adjustment circuit according to an embodiment. FIG. 7 is a schematic structural diagram of a correction circuit according to an embodiment. FIG. 8 is a schematic diagram of a correction principle of a correction circuit according to an embodiment. FIG. 9 is a schematic structural diagram of an amplitude adjustment circuit according to an embodiment. FIG. 10 is a schematic diagram of an adjustment principle of an amplitude adjustment circuit according to an embodiment. The signal generator provided in the embodiments is further described in detail with reference to the accompanying drawings.

Referring to FIG. 1, a signal generator 100 includes an oscillation generation circuit 101, a duty cycle correction circuit 102, an output interface 11 and an amplitude adjustment circuit 103.

The oscillation generation circuit 101 is configured to generate an initial oscillation signal Osc0 based on an oscillation control signal OscAdj. The oscillation control signal OscAdj is used for adjusting a frequency of the generated initial oscillation signal Osc0.

The duty cycle correction circuit 102 is connected to an output end of the oscillation generation circuit 101 and configured to adjust a duty cycle of the initial oscillation signal Osc0 based on a duty cycle control signal Duty, to generate an adjusted oscillation signal Osc1.

The output interface 11 is connected with an output end of the duty cycle correction circuit 102 and configured to output the adjusted oscillation signal Osc1 to an external test system 10, and the external test system 10 is configured to test whether the adjusted oscillation signal Osc1 satisfies a preset condition.

The amplitude adjustment circuit 103 is connected to the output end of the duty cycle correction circuit 102 and configured to adjust an amplitude of the adjusted oscillation signal Osc1 based on an amplitude control signal OBControl, to generate a test signal AltWck.

The preset condition includes whether the duty cycle of the adjusted oscillation signal Osc1 satisfies a preset duty cycle, so as to generate an adjusted oscillation signal Osc1 having a duty cycle satisfying the requirement. In other embodiments, the preset condition further includes whether a frequency of the adjusted oscillation signal satisfies a preset frequency, so as to generate an adjusted oscillation signal having a duty cycle and frequency satisfying requirements.

The oscillation generation circuit 101 is configured to generate the initial oscillation signal Osc0 based on the oscillation control signal OscAdj, and the oscillation control signal OscAdj is used for adjusting the frequency of the generated initial oscillation signal Osc0. The duty cycle correction circuit 102 is configured to adjust the duty cycle of the initial oscillation signal Osc0 based on the duty cycle control signal Duty, to generate the adjusted oscillation signal Osc1, and the duty cycle control signal Duty is used for adjusting the duty cycle of the initial oscillation signal Osc0. The adjusted oscillation signal Osc1 is outputted to the external test system 10 for signal detection, and values of the oscillation control signal OscAdj and the duty cycle control signal Duty are changed according to the detection result, so that the adjusted oscillation signal Osc1 satisfies the preset condition, that is, a high-speed clock signal required by the memory. Then, the amplitude of the adjusted oscillation signal Osc1 is adjusted by the amplitude adjustment circuit 103 based on the amplitude control signal OBControl to generate the test signal AltWck that can be used and tested by the memory. The amplitude control signal OBControl is used for adjusting the amplitude of the adjusted oscillation signal Osc1.

It is to be noted that, in some embodiments, in the process of outputting the adjusted oscillation signal Osc1 to the external test system, the frequency of the adjusted oscillation signal Osc1 is also divided, so that the external test system 10 detects the frequency of the adjusted oscillation signal Osc1, thereby reducing detection accuracy requirement of the external test system 10 for the signal frequency.

In an example, the signal generator 100 further includes an amplitude control circuit. The amplitude control circuit is connected to the amplitude adjustment circuit 103 and configured to supply the amplitude control signal OBControl to the amplitude adjustment circuit 103 when the adjusted oscillation signal Osc1 outputted to external satisfies the preset condition, to enable the amplitude adjustment circuit 103 and perform corresponding amplitude adjustment. That is, when the frequency and duty cycle of the adjusted oscillation signal Osc1 satisfies memory requirements, automatic generation of the test signal AltWck is realized by the amplitude control circuit 103.

Referring to FIG. 2, in some embodiments, the oscillation generation circuit 101 includes a ring oscillator. The ring oscillator is configured to generate the initial oscillation signal Osc0 according to the oscillation control signal OscAdj, and the oscillation control signal OscAdj is used for adjusting the number of inverters connected to the ring oscillator. It is to be understood that the number of inverters connected to the ring oscillator is related to an oscillation frequency of the initial oscillation signal Osc0. Specifically, the more the number of inverters connected to the ring oscillator, the lower the oscillation frequency of the initial oscillation signal Osc0.

Referring to FIG. 3, in some embodiments, the oscillation generation circuit 101 includes a tetrahedral oscillator, and the tetrahedral oscillator includes inner ring inverters and outer ring inverters. Driving capability of the outer ring inverters is the same, driving capability of the inner ring inverters is the same, and the driving capability of each of the inner ring inverters is 0.3-0.8 times of the driving capability of each of the outer ring inverters.

For the tetrahedral oscillator, the tetrahedral oscillator is configured to generate the initial oscillation signal Osc0 according to the oscillation control signal OscAdj, and the oscillation control signal OscAdj is used for adjusting the driving capability of the inner ring inverters. In an example, the oscillation control signal OscAdj is used for adjusting a driving capability of a transistor constituting the inner ring inverter, to adjust the driving capability of the inner-ring inverter. It can be understood that the higher the driving capability of the inner ring inverter in the tetrahedral oscillator, the smaller a delay caused by the inverter, and the larger the frequency of the initial oscillation signal Osc0 generated by the oscillation generating circuit 101. In the practical application, the frequency of the initial oscillation signal Osc0 generated by the oscillation generation circuit 101 may be controlled by changing the ratio of the driving capability of the inner ring inverter to the driving capability of the outer ring inverter.

In an example, the drive capability of each of the inner ring inverters may be set to 0.4, 0.5, 0.6, or 0.7 times the drive capability of each of the outer ring inverters. Preferably, the driving capability of each of the inner ring inverters is set to 0.7 times the driving capability of each of the outer ring inverters, to increase the frequency of the initial oscillation signal Osc0 generated by the oscillation generation circuit 101.

Continuing to refer to FIG. 3, in a specific example, the outer ring inverters include a first inverter 1, a second inverter 2, a third inverter 3 and a fourth inverter 4. The inner ring inverters include a fifth inverter 5, a sixth inverter 6, a seventh inverter 7 and an eighth inverter 8.

An output end of the first inverter 1 is connected to an input end of the second inverter 2. An output end of the second inverter 2 is connected to an input end of the third inverter 3. An output end of the third inverter 3 is connected to an input end of the fourth inverter 4. An output end of the fourth inverter 4 is connected to an input end of the first inverter 1. An input end of the fifth inverter 5 is connected to the output end of the first inverter 1, and an output end of the fifth inverter 5 is connected to the input end of the fourth inverter 4. An input end of the sixth inverter 6 is connected to the output end of the second inverter 2, and an output end of the sixth inverter 6 is connected to the input end of the first inverter 1. An input end of the seventh inverter 7 is connected to the output end of the third inverter 3, and an output end of the seventh inverter 7 is connected to the input end of the second inverter 2. An input end of the eighth inverter 8 is connected to the output end of the fourth inverter 4, and an output end of the eighth inverter 8 is connected to the input end of the third inverter 3.

For the duty cycle correction circuit 102, referring to FIG. 4, the duty cycle correction circuit 102 includes a first adjustment circuit 112, a second adjustment circuit 122 and a correction circuit 132.

The first adjustment circuit 112 is connected to the oscillation generation circuit 101 and configured to increase the duty cycle of the initial oscillation signal Osc0 to generate a first adjustment signal T1.

The second adjusting circuit 122 is connected to the oscillation generation circuit 101 and configured to reduce the duty cycle of the initial oscillation signal Osc0 to generate a second adjusting signal T2.

The correction circuit 132 is connected to the first adjustment circuit 112 and the second adjustment circuit 122 and configured to generate the adjusted oscillation signal Osc1 according to the duty cycle control signal Duty, the first adjustment signal T1 and the second adjustment signal T2. The duty cycle control signal Duty is used for adjusting signal proportion of the first adjustment signal T1 and signal proportion of the second adjustment signal T2 in the generated adjusted oscillation signal Osc1.

Referring to FIG. 5, the first adjustment circuit T1 and the second adjustment circuit T2 adjust the duty cycle of the signal by delaying the rising edge and the falling edge of the signal to different degrees. For example, the delay for the rising edge of the initial signal is t1, and the delay for the falling edge of the initial signal is t2. When t1 t2, a distance between the rising edge and the falling edge of the delayed signal is shortened, and the duty cycle of the signal is decreased. When t1<t2, the distance between the rising edge and the falling edge of the delayed signal is increased, and the duty cycle of the signal is increased.

In a specific example, referring to FIG. 6, the first adjustment circuit 112 includes a first switch positive (P) transistor <KP1>, a first switch negative (N) transistor <KN1>, a second switch P transistor <KP2> and a second switch N transistor <KN2>. A gate of the first switch P transistor <KP1> is connected to a gate of the first switch N transistor <KN1> for receiving the initial oscillation signal Osc0, a source of the first switch P transistor <KP1> is connected to a drain of a first pull-up transistor <LP1>, a source of the first pull-up transistor <LP1> is configured to receive a high level, a source of the first switch N transistor <KN1> is connected to a drain of a first pull-down transistor <LN1>, a source of the first pull-down transistor <LN1> is configured to receive a low level, a drain of the first switch P transistor <KP1> is connected to a drain of the first switch N transistor <KN1>, a gate of the second switch P transistor <KP2> and a gate of the second switch N transistor <KN2>, a source of the second switch P transistor <KP2> is connected to a drain of a second pull-up transistor <LP2>, a source of the second pull-up transistor <LP2> is configured to receive a high level, a source of the second switch N transistor <KN2> is connected to a drain of a second pull-down transistor <LN2>, a source of the second pull-down transistor <LN2> is configured to receive a low level, and a drain of the second switch P transistor <KP2> is connected to a drain of the second switch N transistor <KN2> for outputting the first adjustment signal T1.

The first pull-up transistor <LP1> and the first pull-down transistor <LN1> are turned on based on the duty cycle control signal Duty, and driving capability of the first pull-down transistor <LN1> is larger than that of the first pull-up transistor <LP1>. The second pull-up transistor <LP2> and the second pull-down transistor <LN2> are turned on based on the duty cycle control signal Duty, and driving capability of the second pull-down transistor <LN2> is smaller than that of the second pull-up transistor <LP2>.

The second adjustment circuit 122 includes a third switch P transistor <KP3>, a third switch N transistor <KN3>, a fourth switch P transistor <KP4> and a fourth switch N transistor <KN4>. A gate of the third switch P transistor <KP3> is connected to a gate of the third switch N transistor <KN3> for receiving the initial oscillation signal Osc0, a source of the third switch P transistor <KP3> is connected to a drain of a third pull-up transistor <LP3>, a source of the third pull-up transistor <LP3> is configured to receive a high level, a source of the third switch N transistor <KN3> is connected to a drain of a third pull-down transistor <LN3>, a source of the third pull-down transistor <LN3> is configured to receive a low level, a drain of the third switch P transistor <KP3> is connected to a drain of the third switch N transistor <KN3>, a gate of the fourth switch P transistor <KP4> and a gate of a fourth switch N transistor <KN4>, a source of the fourth switch P transistor <KP4> is connected to a drain of the fourth pull-up transistor <LP4>, a source of the fourth pull-up transistor <LP4> is configured to receive a high level, a source of the fourth switch N transistor <KN4> is connected to a drain of a fourth pull-down transistor <LN4>, a source of the fourth pull-down transistor <LN4> is configured to receive a low level, and a drain of the fourth switch P transistor <KP4> is connected to a drain of the fourth switch N transistor <KN4> for outputting the second adjustment signal T2.

The third pull-up transistor <LP3> and the third pull-down transistor <LN3> are turned on based on the duty cycle control signal Duty, and driving capability of the third pull-down transistor <LN3> is smaller than that of the third pull-up transistor <LP3>. The fourth pull-up transistor <LP4> and the fourth pull-down transistor <LN4> are turned on based on the duty cycle control signal Duty, and driving capability of the fourth pull-down transistor <LN4> is larger than that of the fourth pull-up transistor <LP4>.

It should be noted that, the first pull-up transistor <LP1>, the first pull-down transistor <LN1>, the second pull-up transistor <LP2>, the second pull-down transistor <LN2>, the third pull-up transistor <LP3>, the third pull-down transistor <LN3>, the fourth pull-up transistor <LP4> and the fourth pull-down transistor <LN4> may be turned on directly according to the duty cycle control signal Duty, and may also be turned on according to a duty cycle enable signal generated based on the duty cycle control signal Duty.

For the first adjustment circuit 112, since the conduction capability of the second pull-up transistor <LP2> is larger than that of the second pull-down transistor <LN2>, the first adjustment signal T1 is easy to be pulled up and difficult to be pulled down. Therefore, the first adjustment signal T1 has a smaller rising edge delay and a larger falling edge delay with respect to the initial oscillation signal Osc0. For the second adjustment circuit 122, since the conduction capability of the fourth pull-up transistor <LP4> is smaller than that of the fourth pull-down transistor <LN4>, the second adjustment signal T2 is easy to be pulled down and difficult to be pulled up. Therefore, the second adjustment signal T2 has a larger rising edge delay and a smaller falling edge delay with respect to the initial oscillation signal Osc0.

In some embodiments, the first pull-up transistor <LP1>, the second pull-down transistor <LN2>, the third pull-down transistor <LN3> and the fourth pull-up transistor <LP4> have the same driving capability. The first pull-down transistor <LN1>, the second pull-up transistor <LP2>, the third pull-up transistor <LP3> and the fourth pull-down transistor <LN4> have the same driving capability.

Specifically, referring to FIG. 6, the driving capability of the first pull-up transistor <LP1>, the driving capability of the second pull-down transistor <LN2>, the driving capability of the third pull-down transistor <LN3> and the driving capability of the fourth pull-up transistor <LP4> are B; and the driving capability of the first pull-down transistor <LN1>, the driving capability of the second pull-up transistor <LP2>, the driving capability of the third pull-up transistor <LP3> and the driving capability of the fourth pull-down transistor <LN4> are A. The driving capability represented by A is greater than that represented by B.

By setting the driving capability of the first pull-up transistor <LP1>, the driving capability of the second pull-down transistor <LN2>, the driving capability of the third pull-down transistor <LN3> and the driving capability of the fourth pull-up transistor <LP4> being the same, and setting the driving capability of the first pull-down transistor <LN1>, the driving capability of the second pull-up transistor <LP2>, the driving capability of the third pull-up transistor <LP3> and the driving capability of the fourth pull-down transistor <LN4> being the same, the adjustment capability of the first adjustment circuit 112 to the rising edge and the adjustment capability of the second adjustment circuit 122 to the falling edge are controlled to be the same by the same transistor, the adjustment capability of the first adjustment circuit 112 to the falling edge and the adjustment capability of the second adjustment circuit 122 to the rising edge are controlled to be the same by the same transistor, so that the total adjustment delay of the first adjustment circuit 112 for the rising edge and the falling edge is consistent with that of the second adjustment circuit 122 for the rising edge and the falling edge, to ensure periods of the first adjustment signal T1 and the second adjustment signal T2 are the same, thereby facilitating the correction circuit 132 to perform duty cycle adjustment according to the first adjustment signal T1 and the second adjustment signal T2.

In some embodiments the first adjustment circuit 112 and the second adjustment circuit 122 also include correction transistor groups 142.

Each correction transistor group 142 includes x correction transistors arranged in parallel, driving capability of the nth correction transistor is twice driving capability of the (n−1)th correction transistor in the x correction transistors, x is an integer greater than or equal to 2, and n is an integer less than or equal to x and greater than or equal to 2. Further, the duty cycle control signal Duty is also used for selectively conducting part of the correction transistors in each correction transistor group 142. In such case, the driving capability of the correction transistor group 142 refers to the equivalent driving capability of multiple correction transistors that are turned on.

Each of the correction transistor groups 142 is respectively arranged in parallel with one of the first pull-up transistor <LP1>, the first pull-down transistor <LN1>, the second pull-up transistor <LP2>, the second pull-down transistor <LN2>, the third pull-up transistor <LP3>, the third pull-down transistor <LN3>, the fourth pull-up transistor <LP4> and the fourth pull-down transistor <LN4>. A type of each correction transistor in the correction transistor group 142 is the same as that of the transistor to be connected in parallel with the correction transistor group 142.

In a specific example, continuing to refer to FIG. 6, each correction transistor group 142 includes a first correction transistor, a second correction transistor, a third correction transistor, a fourth correction transistor and a fifth correction transistor. Driving capability of the first correction transistor is C, driving capability of the second correction transistor is 2 C, driving capability of the third correction transistor is 4 C, driving capability of the fourth correction transistor is 8 C, and driving capability of the fifth correction transistor is 16 C. The first correction transistor, the second correction transistor, the third correction transistor, the fourth correction transistor, and the fifth correction transistor are selectively conducted based on the duty cycle control signal Duty, thereby controlling the first adjustment circuit 112 and the second adjustment circuit 122 to delay the initial oscillation signal Osc0 to different degrees.

It is to be noted that the "C" mentioned above represents a preset circuit value, which can be designed according to the circuit design in specific applications. The above description is only to reflect multiple relationship of the driving capability between the correction transistors.

It is to be noted that in the present embodiment, the multiple correction transistors in each of the correction transistor groups 142 are arranged in parallel, and in other embodiments, the multiple correction transistors in each of the correction transistor groups may be arranged in series or in a series-parallel combination connection.

Referring to FIG. 7, the correction circuit 132 includes multiple first driving subcircuits arranged in parallel with each other, multiple second driving subcircuits arranged in parallel with each other, and a third driving subcircuit 213.

An input end of each of the multiple first driving subcircuits is connected to the first adjustment circuit 112 and configured to receive the duty cycle control signal Duty.

An input end of each of the multiple second driving subcircuits is connected to the second adjustment circuit 122 and configured to receive the duty cycle control signal Duty.

The duty cycle control signal Duty is used for selectively conducting parts of the multiple first driving subcircuits and the multiple second driving subcircuits.

The third driving subcircuit 213 includes an input end connected to output ends of the first driving subcircuits and output ends of the second driving subcircuits, and an output end configured to output the adjusted oscillation signal Osc1.

Specifically, when driving capability of the multiple first driving subcircuits is larger than that of the multiple second driving subcircuits, the duty cycle of the adjusted oscillation signal Osc1 outputted by the third driving subcircuit 213 is more inclined to the first adjustment signal T1, that is, the proportion of the first adjustment signal T1 in the adjusted oscillation signals Osc1 generated according to the first adjustment signal T1 and the second adjustment signal T2 is larger. When driving capability of the multiple second driving subcircuits is larger than that of the multiple first driving subcircuits, the duty cycle of the adjusted oscillation signal Osc1 outputted by the third driving subcircuit 213 is more inclined to the second adjustment signal T2, that is, the proportion of the second adjustment signal T2 in the adjusted oscillation signals Osc1 generated according to the first adjustment signal T1 and the second adjustment signal T2 is larger. It is to be understood that the driving capability of the multiple first driving subcircuits refers to the equivalent driving capability of the first driving subcircuits that are conducted in the multiple first driving subcircuits. Similarly, the driving capability of the multiple second driving subcircuits refers to the equivalent driving capability of the second driving subcircuit that are conducted in the multiple second driving subcircuits.

In some embodiments, continuing to refer to FIG. 7, the signal generator 100 includes a first inverter group 211, a second inverter group 212 and a third driving subcircuit 213.

The first inverter group 211 is configured to receive the duty cycle control signal Duty. The first inverter group 211 includes multiple first adjustment inverters 201 in parallel, each of the first adjustment inverters 201 serves as a first driving subcircuit, and the duty cycle control signal Duty is used for selectively conducting part of the first adjustment inverters 201 in the first inverter group 211.

An input end of the second inverter group 212 is connected to the second adjustment circuit 122 and is also configured to receive the duty cycle control signal Duty. The second inverter group 212 includes multiple second adjustment inverters 202 in parallel, each of the second adjustment inverters 202 serves as a second driving subcircuit, and the duty cycle control signal Duty is used for selectively conducting part of the second adjustment inverters 202 in the second inverter group 212.

The third driving subcircuit 213 includes a third adjustment inverter 203. An input end of the third adjustment inverter 203 is connected to an output end of the first inverter group 211 and an output end of the second inverter group 212, and an output end of the third adjustment inverter 203 is configured to output the adjusted oscillation signal Osc1.

Since the first inverter group 211 includes the multiple first inverters 201 (i.e., first adjustment inverters) in parallel and the second inverter group 212 includes the multiple second inverters 202 (i.e., second adjustment inverters) in parallel, the more the number of the conducted inverters in parallel, the higher the conduction capability of the first inverters 201 or the second inverters 202 as a whole, that is, by controlling the number of the conducted first inverters 201 and second inverters 202 in the first inverter group 211 and the second inverter group 212, the duty cycle of the adjusted oscillation signal Osc1 is adjusted.

In a specific example, referring to FIG. 8, it is assumed that the first inverter group 211 includes three first inverters 201 and the second inverter group 212 includes three second inverters 202, that is, the correction circuit includes three first driving subcircuits and three second driving subcircuits. In such case, the conduction conditions of the first driving subcircuits and the second driving subcircuits may include the following.

(1) When 3 first driving subcircuits and 0 second driving subcircuit are conducted, the duty cycle of the adjusted oscillation signal Osc1 is the same as that of the first adjustment signal T1, and the duration of the high-level signal is tpH3.

(2) When 2 first driving subcircuits and 1 second driving subcircuit are conducted, the adjusted oscillation signal Osc1 is inclined to the first adjustment signal T1, and the duration of the high-level signal is tpH2.

(3) When 1 first driving subcircuit and 2 second driving subcircuits are conducted, the adjusted oscillation signal Osc1 is inclined to the second adjustment signal T2, and the duration of the high-level signal is tpH1.

(4) When 0 first driving subcircuit and 3 second driving subcircuits are conducted, the duty cycle of the adjusted oscillation signal Osc1 is the same as that of the second adjustment signal T2, and the duration of the high-level signal is tpH0.

For the amplitude adjustment circuit 103, referring to FIG. 9, the amplitude adjustment circuit 103 includes a first signal generation circuit 113 and a second signal generation circuit 123.

The first signal generation circuit 113 is configured to pull up an output signal based on the adjusted oscillation signal Osc1 and pull down the output signal based on an inverted oscillation signal Osc2, to generate the test signal AltWck having a same phase as the adjusted oscillation signal Osc1.

The second signal generation circuit 123 is configured to pull up the output signal based on the inverted oscillation signal Osc2 and pull down the output signal based on the adjusted oscillation signal Osc1, to generate an inverted test signal AltWck-having a same phase as the inverted oscillation signal Osc2.

The adjusted oscillation signal Osc1 and the inverted oscillation signal Osc2 have the same amplitudes and opposite phases.

Specifically, in some embodiments, the signal generator further includes a signal generation circuit 300. The signal generation circuit 300 is connected to the amplitude adjustment circuit 103 and the duty cycle correction circuit 102 and configured to generate the inverted oscillation signal Osc2 based on the adjusted oscillation signal Osc1.

Continuing to refer to FIG. 9, in a specific example, the first signal generation circuit 113 includes a first driving transistor <QN1> and a second driving transistor <QN2>.

A gate of the first driving transistor <QN1> is configured to receive the adjusted oscillation signal Osc1, a drain of the first driving transistor <QN1> is configured to receive a high level, a gate of the second driving transistor <QN2> is configured to receive the inverted oscillation signal Osc2, a source of the second driving transistor <QN2> is configured to receive a low level, and a source of the first driving transistor <QN1> is connected to a drain of the second driving transistor <QN2> for outputting the test signal AltWck. The amplitude control signal OBControl is used for adjusting driving capability of the first driving transistor <QN1>.

It is to be noted that, in the present embodiment, the amplitude control signal OBControl changes the driving capability of the first signal generation circuit 113 by adjusting the driving capability of the first driving transistor <QN1>. In other embodiments, the amplitude control signal may change the driving capability of the first signal generation circuit by adjusting the driving capability of the second driving transistor or by jointly adjusting the driving capability of the first driving transistor and the second driving transistor.

The second signal generation circuit 123 includes a third driving transistor <QN3> and a fourth driving transistor <QN4>.

A gate of the third driving transistor <QN3> is configured to receive the inverted oscillation signal Osc2, a drain of the third driving transistor <QN3> is configured to receive a high level, a gate of the fourth driving transistor <QN4> is configured to receive the adjusted oscillation signal Osc1, a source of the fourth driving transistor <QN4> is configured to receive a low level, and a source of the third driving transistor <QN3> is connected to a drain of the fourth driving transistor <QN4> for outputting the inverted test signal AltWck–. The amplitude control signal OBControl is used for adjusting driving capability of the third driving transistor <QN3>.

It is to be noted that, in the present embodiment, the amplitude control signal OBControl changes the driving capability of the second signal generation circuit 123 by adjusting the driving capability of the third driving transistor <QN3>. In other embodiments, the amplitude control signal may change the driving capability of the second signal generation circuit by adjusting the driving capability of the fourth driving transistor or by jointly adjusting the driving capability of the third driving transistor and the fourth driving transistor.

In an example, the amplitude control signal OBControl may adjust the driving capability of the first driving transistor <QN1> and the third driving transistor <QN3> by changing width-to-length ratios or substrate voltages of the first driving transistor <QN1> and the third driving transistor <QN3>. Similarly, the driving capability of the second driving transistor and the fourth driving transistor may be adjusted in the similar manner.

Further, the first signal generation circuit 113 further includes a first switching transistor <B1>, a second switching transistor <B2> and a first anti-interference transistor <B3>.

A source of the first switching transistor <B1> is coupled to a power supply node, a drain of the first switching transistor <B1> is connected to the drain of the first driving transistor <QN1>, a gate of the first switching transistor <B1> is configured to receive the amplitude control signal OBControl, a source of the second switching transistor <B2> is coupled to a ground node, a drain of the second switching transistor <B2> is connected to the drain of the second driving transistor <QN2>, and a gate of the second switching transistor <B2> is configured to receive the amplitude control signal OBControl, so that the first signal generation circuit 113 is conducted after receiving the amplitude control signal OBControl, thereby reducing power consumption of the first signal generation circuit 113 in idle. In addition, the first anti-interference transistor <B3> is connected in parallel with the second driving transistor <QN2>, and a gate of the first anti-interference transistor <B3> is configured to receive the amplitude control signal OBControl. The amplitude control signal OBControl is also used for adjusting driving capability of the first anti-interference transistor <B3>, thereby adjusting the anti-interference capability of the first anti-interference transistor <B3>.

Since the driving capability of the first driving transistor <QN1> may be adjusted based on the amplitude control signal OBControl, that is, when the driving capability of the first driving transistor <QN1> is large, the amplitude of the outputted test signal AltWck is large, and the required anti-interference capability is high. When the driving capability of the first driving transistor <QN1> is small, the amplitude of the outputted test signal AltWck is small, and the required anti-interference capability is low. Therefore, the anti-interference capability of the first anti-interference transistor <B3> is correspondingly adjusted through the amplitude control signal OBControl, to ensure the accuracy of the test signal AltWck generated by the first signal generation circuit 113 and reduce the power consumption of the first anti-interference transistor <B3>.

In the present embodiment, the amplitude control signal OBControl is also used for enabling the first switching transistor <B1>, the second switching transistor <B2> and the first anti-interference transistor <B3>, and adjusting the driving capability of the first anti-interference transistor <B3> simultaneously. In other embodiments, the first switching transistor, the second switching transistor and the first anti-interference transistor may be arranged to be conducted based on an amplitude enabled signal generated based on the amplitude control signal.

The second signal generation circuit 123 further includes a third switching transistor <B4>, a fourth switching transistor <B5> and a second anti-interference transistor <B6>.

A source of the third switching transistor <B4> is coupled to a power supply node, a drain of the third switching transistor <B4> is connected to the drain of the third driving transistor <QN3>, a gate of the third switching transistor <B4> is configured to receive the amplitude control signal OBControl, a source of the fourth switching transistor <B5> is coupled to a ground node, a drain of the fourth switching transistor <B5> is connected to the drain of the fourth driving transistor <QN4>, and a gate of the fourth switching transistor <B5> is configured to receive the amplitude control signal OBControl, so that the second signal generation circuit 123 is conducted after receiving the amplitude control signal OBControl, thereby reducing the power consumption of the second signal generation circuit 123 in idle. In addition, the second anti-interference transistor <B6> is connected in parallel with the fourth driving transistor <QN4>, and a gate of the second anti-interference transistor <B6> is configured to receive the amplitude control signal OBControl. The amplitude control signal OBControl is used for adjusting driving capability of the second anti-interference transistor <B6>, thereby adjusting the anti-interference capability of the second anti-interference transistor <B6>.

Since the driving capability of the third driving transistor <QN3> may be adjusted based on the amplitude control signal OBControl, that is, when the driving capability of the third driving transistor <QN3> is large, the amplitude of the outputted inverted test signal AltWck— is large, and the required anti-interference capability is high. When the driving capability of the third driving transistor <QN3> is small, the amplitude of the outputted inverted test signal AltWck— is small, and the required anti-interference capability is low. Therefore, the anti-interference capability of the second anti-interference transistor <B6> is correspondingly adjusted through the amplitude control signal OBControl, to ensure the accuracy of the inverted test signal AltWck— generated by the second signal generation circuit 123 and reduce the power consumption of the second anti-interference transistor <B6>.

In the present embodiment, the amplitude control signal OBControl is also used for enabling the third switching transistor <B4>, the fourth switching transistor <B5> and the second anti-interference transistor <B6>, and adjusting the driving capability of the second anti-interference transistor <B6> simultaneously. In other embodiments, the third switching transistor, the fourth switching transistor and the second anti-interference transistor may be arranged to be conducted based on the amplitude enable signal generated based on the amplitude control signal.

It is to be noted that, the present embodiment is described in detail by taking the first signal generation circuit 113 generating the test signal AltWck and the second signal generation circuit 123 generating the inverted test signal AltWck—as an example, which is not limited to the present embodiment. In other embodiments, it may be arranged that the inverted test signal is generated by the first signal generation circuit and the test signal is generated by the second signal generation circuit.

In some embodiments, the amplitude control signal OBControl is also used for controlling the input of the adjusted oscillation signal Osc1 and the inverted oscillation signal Osc2.

Specifically, the signal generator 100 further includes a first driving circuit 301 and a second driving circuit 302.

The first driving circuit 301 is configured to receive the amplitude control signal OBControl and the adjusted oscillation signal Osc1 and further configured to output one of the adjusted oscillation signal Osc1 and the inverted oscillation signal Osc2 in response to receiving the amplitude control signal OBControl and the adjusted oscillation signal Osc1 simultaneously.

The second driving circuit 302 is configured to receive the amplitude control signal OBControl and the inverted oscillation signal Osc2 and further configured to output the other of the adjusted oscillation signal Osc1 and the inverted oscillation signal Osc2 in response to receiving the amplitude control signal OBControl and the inverted oscillation signal Osc2 simultaneously.

Specifically, if the first driving circuit 301 is designed based on a NAND gate and receives the amplitude control signal OBControl and the adjusted oscillation signal Osc1 simultaneously, the inverted oscillation signal Osc2 is outputted. If the first driving circuit 301 is designed based on an AND gate and receives the amplitude control signal OBControl and the adjusted oscillation signal Osc1 simultaneously, the adjusted oscillation signal Osc1 is outputted. If the second driving circuit 302 is designed based on a NAND gate and receives the amplitude control signal OBControl and the inverted oscillation signal Osc2 simultaneously, the adjusted oscillation signal Osc1 is outputted. If the second driving circuit 302 is designed based on an AND gate and receives the amplitude control signal OBControl and the inverted oscillation signal Osc2 simultaneously, the inverted oscillation signal Osc2 is outputted.

It is to be noted that, in the present embodiment, the amplitude control signal OBControl is also used for enabling the first driving circuit 301 and the second driving circuit 302. In other embodiments, the first driving circuit and the second driving circuit may be arranged to be conducted based on the amplitude enabled signal generated based on the amplitude control signal.

Continuing to refer to FIG. 9, since the device distance between the first driving circuit 301 and the first signal generation circuit 113 and the device distance between the second driving circuit 302 and the second signal generation circuit 123 is relatively large, the outputted adjusted oscillation signal Osc1 and inverted oscillation signal Osc2 may have a phenomenon of signal attenuation. In order to avoid the phenomenon, in some embodiments, the amplitude adjustment circuit 103 further includes a first input adjustment circuit 310, a second input adjustment circuit 320, a third input adjustment circuit 330 and a fourth input adjustment circuit 340.

The first input adjustment circuit 310 is connected to the first signal generation circuit 113 and configured to drive the adjusted oscillation signal Osc1 supplied to the first signal generation circuit 113. The second input adjustment circuit 320 is connected to the second signal generation circuit 123 and configured to drive the adjusted oscillation signal Osc1 supplied to the second signal generation circuit 123. The third input adjusting circuit 330 is connected to the first signal generation circuit 113 and configured to drive the inverted oscillation signal Osc2 supplied to the first signal generation circuit 113. The fourth input adjusting circuit 340 is connected to the second signal generation circuit 123 and configured to drive the inverted oscillation signal Osc2 supplied to the second signal generation circuit 123.

In an example, an even number of inverters are included in the first input adjustment circuit 310, the second input adjustment circuit 320, the third input adjustment circuit 330, and the fourth input adjustment circuit 340.

In another example, an odd number of inverters included in the first input adjustment circuit 310, the second input adjustment circuit 320, the third input adjustment circuit 330, and the fourth input adjustment circuit 340. In such case, the first input adjustment circuit 310 is configured to supply the inverted oscillation signal Osc2 to the first signal generation circuit 113. The second input adjustment circuit 320 is configured to supply the inverted oscillation signal Osc2 to the second signal generation circuit 123. The third input adjustment circuit 330 is configured to supply the adjusted oscillation signal Osc1 to the first signal generation circuit 113. The fourth input adjustment circuit 340 is configured to supply the adjusted oscillation signal Osc1 to the second signal generation circuit 123.

Referring to FIG. 10, the test signal AltWck and the inverted test signal AltWck—generated after the adjusted oscillation signal Osc1 and the inverted oscillation signal Osc2 pass through the amplitude adjustment circuit 103 have the same phase as the adjusted oscillation signal Osc1 and the inverted oscillation signal Osc2, and have the amplitudes changed from V1 to V2, so as to satisfies the subsequent use requirements.

It is to be noted that the "conduction capability" mentioned in the embodiments of the present disclosure refers to the conduction capability of the source-drain current of the transistors under a condition that the gates of the transistors are opened at the same degree.

The oscillation generation circuit 101 is configured to generate the initial oscillation signal Osc0 based on the oscillation control signal OscAdj, and the oscillation control signal OscAdj is used for adjusting the frequency of the generated initial oscillation signal Osc0. The duty cycle correction circuit 102 is configured to adjust the duty cycle of the initial oscillation signal Osc0 based on the duty cycle control signal Duty, to generate the adjusted oscillation signal Osc1, and the duty cycle control signal Duty is used for adjusting the duty cycle of the initial oscillation signal Osc0. The adjusted oscillation signal Osc1 is outputted to the external test system 10 for signal detection, and values of the oscillation control signal OscAdj and the duty cycle control signal Duty are changed according to the detection result, so that the adjusted oscillation signal Osc1 satisfies the preset condition, that is, a high-speed clock signal required by the memory. Then, the amplitude of the adjusted oscillation signal Osc1 is adjusted by the amplitude adjustment circuit 103 based on the amplitude control signal OBControl to generate the test signal AltWck that can be used and tested by the memory. The amplitude control signal OBControl is used for adjusting the amplitude of the adjusted oscillation signal Osc1.

It is to be noted that the features disclosed in the signal generator provided by the above embodiments may be arbitrarily combined without conflict to obtain new embodiments of the signal generator.

Another embodiment of the present disclosure provides a memory. The memory is configured for generating a test signal having a duty cycle satisfying a preset condition based on the signal generator provided by the above embodiments.

In some embodiments, the memory is a dynamic random access memory (DRAM) chip, and a memory of the DRAM chip is conformed to the 2nd double data rate (DDR2) memory specification.

In some embodiments, the memory is a DRAM chip, and a memory of the DRAM chip is conformed to the 3rd DDR (DDR3) memory specification.

In some embodiments, the memory is a DRAM chip, and a memory of the DRAM chip is conformed to 4th DDR (DDR4) memory specifications.

In some embodiments, the memory is a DRAM chip, and a memory of the DRAM chip is conformed to 5th DDR (DDR5) memory specifications.

Those of ordinary skill in the art may understand that the above embodiments are specific embodiments for implementing the present disclosure, and in practical applications, various changes may be made thereto in form and detail without departing from the spirit and scope of the present disclosure.

What is claimed is:

1. A signal generator, comprising:
an oscillation generation circuit, configured to generate an initial oscillation signal based on an oscillation control signal, wherein the oscillation control signal is used for adjusting a frequency of the generated initial oscillation signal;
a duty cycle correction circuit, connected to an output end of the oscillation generation circuit and configured to adjust a duty cycle of the initial oscillation signal based on a duty cycle control signal, to generate an adjusted oscillation signal;
an output interface, connected to an output end of the duty cycle correction circuit and configured to output the adjusted oscillation signal to an external test system, wherein the external test system is configured to test whether the adjusted oscillation signal satisfies a preset condition; and
an amplitude adjustment circuit, connected to the output end of the duty cycle correction circuit and configured to adjust an amplitude of the adjusted oscillation signal based on an amplitude control signal, to generate a test signal,
wherein the duty cycle correction circuit comprise;
a first adjustment circuit, connected to the oscillation generation circuit and configured to increase the duty cycle of the initial oscillation signal to generate a first adjustment signal;
a second adjustment circuit, connected to the oscillation generation circuit and configured to reduce the duty cycle of the initial oscillation signal to generate a second adjustment signal; and
a correction circuit, connected to the first adjustment circuit and the second adjustment circuit and configured to generate the adjusted oscillation signal according to the duty cycle control signal, the first adjustment signal and the second adjustment signal, wherein the duty cycle control signal is used for adjusting signal proportion of the first adjustment signal and signal proportion of the second adjustment signal in the generated adjusted oscillation signal.

2. The signal generator of claim 1, wherein the oscillation generation circuit comprises a ring oscillator configured to generate the initial oscillation signal according to the oscillation control signal, and the oscillation control signal is used for adjusting a number of inverters connected to the ring oscillator.

3. The signal generator of claim 1, wherein the oscillation generation circuit comprises a tetrahedral oscillator; and
the tetrahedral oscillator comprises inner ring inverters and outer ring inverters;
wherein driving capability of the outer ring inverters is the same, driving capability of the inner ring inverters is the same, and the driving capability of each of the inner ring inverters is 0.3-0.8 times of the driving capability of each of the outer ring inverters.

4. The signal generator of claim 3, wherein the tetrahedral oscillator is configured to generate the initial oscillation signal according to the oscillation control signal, and the oscillation control signal is used for adjusting the driving capability of the inner ring inverters.

5. The signal generator of claim 1, wherein the correction circuit comprises:
a plurality of first driving subcircuits arranged in parallel with each other, wherein an input end of each first driving subcircuit is connected to the first adjustment circuit and configured to receive the duty cycle control signal;
a plurality of second driving subcircuits arranged in parallel with each other, wherein an input end of each second driving subcircuit is connected to the second adjustment circuit and configured to receive the duty cycle control signal,
wherein the duty cycle control signal is used for selectively conducting part of the plurality of first driving subcircuits and the plurality of second driving subcircuits; and
a third driving subcircuit, comprising an input end connected to output ends of the first driving subcircuits and output ends of the second driving subcircuits, and an output end configured to output the adjusted oscillation signal.

6. The signal generator of claim 5, further comprising:
a first inverter group, configured to receive the duty cycle control signal,
wherein the first inverter group comprises a plurality of first adjustment inverters in parallel, each of the first adjustment inverters serves as a first driving subcircuit, and the duty cycle control signal is used for selectively conducting part of the first adjustment inverters in the first inverter group;
a second inverter group, configured to receive the duty cycle control signal,
wherein the second inverter group comprises a plurality of second adjustment inverters in parallel, each of the second adjustment inverters serves as a second driving subcircuit, and the duty cycle control signal is used for selectively conducting part of the second adjustment inverters in the second inverter group; and
a third driving subcircuit, comprising a third adjustment inverter, wherein an input end of the third adjustment inverter is connected to an output end of the first inverter group and an output end of the second inverter group, and an output end of the third adjustment inverter is configured to output the adjusted oscillation signal.

7. The signal generator of claim 1, wherein:

the first adjustment circuit comprises a first switch positive (P) transistor, a first switch negative (N) transistor, a second switch P transistor and a second switch N transistor, wherein a gate of the first switch P transistor is connected to a gate of the first switch N transistor for receiving the initial oscillation signal, a source of the first switch P transistor is connected to a drain of a first pull-up transistor, a source of the first pull-up transistor is configured to receive a high level, a source of the first switch N transistor is connected to a drain of a first pull-down transistor, a source of the first pull-down transistor is configured to receive a low level, a drain of the first switch P transistor is connected to a drain of the first switch N transistor, a gate of the second switch P transistor and a gate of the second switch N transistor, a source of the second switch P transistor is connected to a drain of a second pull-up transistor, a source of the second pull-up transistor is configured to receive a high level, a source of the second switch N transistor is connected to a drain of a second pull-down transistor, a source of the second pull-down transistor is configured to receive a low level, and a drain of the second switch P transistor is connected to a drain of the second switch N transistor for outputting the first adjustment signal; and wherein the first pull-up transistor and the first pull-down transistor are turned on based on the duty cycle control signal, and driving capability of the first pull-down transistor is larger than that of the first pull-up transistor; the second pull-up transistor and the second pull-down transistor are turned on based on the duty cycle control signal, and driving capability of the second pull-down transistor is smaller than that of the second pull-up transistor; and the second adjustment circuit comprises a third switch P transistor, a third switch N transistor, a fourth switch P transistor and a fourth switch N transistor, wherein a gate of the third switch P transistor is connected to a gate of the third switch N transistor for receiving the initial oscillation signal, a source of the third switch P transistor is connected to a drain of a third pull-up transistor, a source of the third pull-up transistor is configured to receive a high level, a source of the third switch N transistor is connected to a drain of a third pull-down transistor, a source of the third pull-down transistor is configured to receive a low level, a drain of the third switch P transistor is connected to a drain of the third switch N transistor, a gate of the fourth switch P transistor and a gate of a fourth switch N transistor, a source of the fourth switch P transistor is connected to a drain of the fourth pull-up transistor, a source of the fourth pull-up transistor is configured to receive a high level, a source of the fourth switch N transistor is connected to a drain of a fourth pull-down transistor, a source of the fourth pull-down transistor is configured to receive a low level, and a drain of the fourth switch P transistor is connected to a drain of the fourth switch N transistor for outputting the second adjustment signal; and wherein the third pull-up transistor and the third pull-down transistor are turned on based on the duty cycle control signal, and driving capability of the third pull-down transistor is smaller than that of the third pull-up transistor; the fourth pull-up transistor and the fourth pull-down transistor are turned on based on the duty cycle control signal, and driving capability of the fourth pull-down transistor is larger than that of the fourth pull-up transistor.

8. The signal generator of claim 7, wherein:

driving capability of the first pull-up transistor, the driving capability of the second pull-down transistor, the driving capability of the third pull-down transistor and the driving capability of the fourth pull-up transistor are the same; and the driving capability of the first pull-down transistor, the driving capability of the second pull-up transistor, the driving capability of the third pull-up transistor and the driving capability of the fourth pull-down transistor are the same.

9. The signal generator of claim 7, wherein the first adjustment circuit and the second adjustment circuit further comprise correction transistor groups; wherein each of the correction transistor groups comprises x correction transistors arranged in parallel, and driving capability of a nth correction transistor is twice that of a (n−1)th correction transistor in the x correction transistors, x being an integer greater than or equal to 2, and n being an integer less than or equal to the x and greater than or equal to 2;

the duty cycle control signal is further used for selectively conducting part of the correction transistors in the correction transistor group; and the correction transistor group is arranged in parallel with one of the first pull-up transistor, the first pull-down transistor, the second pull-up transistor, the second pull-down transistor, the third pull-up transistor, the third pull-down transistor, the fourth pull-up transistor and the fourth pull-down transistor;

wherein a type of each correction transistor in the correction transistor group is the same as that of a transistor connected in parallel with the correction transistor group.

10. The signal generator of claim 1, wherein the amplitude adjustment circuit comprises:

a first signal generation circuit, configured to pull up an output signal based on the adjusted oscillation signal and pull down the output signal based on an inverted oscillation signal, to generate the test signal having a same phase as the adjusted oscillation signal; and a second signal generation circuit, configured to pull up the output signal based on the inverted oscillation signal and pull down the output signal based on the adjusted oscillation signal, to generate an inverted test signal having a same phase as the inverted oscillation signal;

wherein the adjusted oscillation signal and the inverted oscillation signal have same amplitudes and opposite phases.

11. The signal generator of claim 10, wherein:

the first signal generation circuit comprises a first driving transistor and a second driving transistor, wherein a gate of the first driving transistor is configured to receive the adjusted oscillation signal, a drain of the first driving transistor is configured to receive a high level, a gate of the second driving transistor is configured to receive the inverted oscillation signal, a source of the second driving transistor is configured to receive a low level, and a source of the first driving transistor is connected to a drain of the second driving transistor for outputting the test signal; and the amplitude control signal is used for adjusting driving capability of the first driving transistor; and the second signal generation circuit comprises a third driving transistor and a fourth driving transistor, wherein a gate of the third driving transistor is configured to receive the inverted oscillation signal, a drain of the third driving transistor is configured to receive a high level, a gate of the fourth driving transistor is configured to receive the adjusted oscillation signal, a source of the fourth driving transistor is configured to receive a low level, and a source of the third driving transistor is connected to a drain of the fourth driving transistor for outputting the inverted test signal; and the amplitude control signal is used for adjusting driving capability of the third driving transistor.

12. The signal generator of claim 11, wherein:

the first signal generation circuit further comprises a first switching transistor, a second switching transistor and a first anti-interference transistor, wherein a source of the first switching transistor is coupled to a power supply node, a drain of the first switching transistor is connected to the drain of the first driving transistor, a gate of the first switching transistor is configured to receive the amplitude control signal, a source of the second switching transistor is coupled to a ground node, a drain of the second switching transistor is connected to the drain of the second driving transistor, a gate of the second switching transistor is configured to receive the amplitude control signal, the first anti-interference transistor is connected in parallel with the second driving transistor, and a gate of the first anti-interference transistor is configured to receive the amplitude control signal; and the amplitude control signal is used for adjusting driving capability of the first anti-interference transistor; and the second signal generation circuit further comprising a third switching transistor, a fourth switching transistor and a second anti-interference transistor, wherein a source of the third switching transistor is coupled to a power supply node, a drain of the third switching transistor is connected to the drain of the third driving transistor, a gate of the third switching transistor is configured to receive the amplitude control signal, a source of the fourth switching transistor is coupled to a ground node, a drain of the fourth switching transistor is connected to the drain of the fourth driving transistor, a gate of the fourth switching transistor is configured to receive the amplitude control signal, the second anti-interference transistor is connected in parallel with the fourth driving transistor, and a gate of the second anti-interference transistor is configured to receive the amplitude control signal; and the amplitude control signal is used for adjusting driving capability of the second anti-interference transistor.

13. The signal generator of claim 10, further comprising:

a first driving circuit, configured to receive the amplitude control signal and the adjusted oscillation signal and further configured to output one of the adjusted oscillation signal and the inverted oscillation signal in response to receiving the amplitude control signal and the adjusted oscillation signal simultaneously; and a second driving circuit, configured to receive the amplitude control signal and the inverted oscillation signal and further configured to output the other of the adjusted oscillation signal and the inverted oscillation signal in response to receiving the amplitude control signal and the inverted oscillation signal simultaneously.

14. The signal generator of claim 10, wherein the amplitude adjustment circuit further comprises:

a first input adjustment circuit, connected to the first signal generation circuit and configured to drive the adjusted oscillation signal supplied to the first signal generation circuit;

a second input adjustment circuit, connected to the second signal generation circuit and configured to drive the adjusted oscillation signal supplied to the second signal generation circuit;

a third input adjustment circuit, connected to the first signal generation circuit and configured to drive the inverted oscillation signal supplied to the first signal generation circuit; and a fourth input adjustment circuit, connected to the second signal generation circuit and configured to drive the inverted oscillation signal supplied to the second signal generation circuit.

15. The signal generator of claim 10, further comprising:

a signal generation circuit, connected to the amplitude adjustment circuit and the duty cycle correction circuit and configured to generate the inverted oscillation signal based on the adjusted oscillation signal.

16. The signal generator of claim 1, further comprising: an amplitude control circuit, connected to the amplitude adjustment circuit and configured to supply the amplitude control signal to the amplitude adjustment circuit when the adjusted oscillation signal outputted to external satisfies the preset condition.

17. A memory, configured for generating a test signal having a duty cycle satisfying a preset condition based on a signal generator, the signal generator comprising:

an oscillation generation circuit, configured to generate an initial oscillation signal based on an oscillation control signal, wherein the oscillation control signal is used for adjusting a frequency of the generated initial oscillation signal;

a duty cycle correction circuit, connected to an output end of the oscillation generation circuit and configured to adjust a duty cycle of the initial oscillation signal based on a duty cycle control signal, to generate an adjusted oscillation signal;

an output interface, connected to an output end of the duty cycle correction circuit and configured to output the adjusted oscillation signal to an external test system, wherein the external test system is configured to test whether the adjusted oscillation signal satisfies a preset condition; and an amplitude adjustment circuit, connected to the output end of the duty cycle correction circuit and configured to adjust an amplitude of the adjusted oscillation signal based on an amplitude control signal, to generate a test signal;

wherein the duty cycle on circuit comprises;

a first adjustment circuit, connected to the oscillation circuit and configured to increase the duty cycle of the initial oscillation signal generate a first adjustment signal;

a second adjustment circuit, connected to the oscillation generation circuit and configured to reduce the duty cycle of the initial oscillation signal to generate a second adjustment signal; and a correction circuit, connected to the first adjustment circuit and the second adjustment circuit and configured to generate the adjusted oscillation signal according to the duty cycle control signal, the first adjustment signal and the second adjustment signal, wherein the duty cycle control signal is used for adjusting signal proportion of the first adjustment signal and signal proportion of the second adjustment signal in the generated adjusted oscillation signal.

18. The memory of claim 17, wherein the memory is a dynamic random access memory (DRAM) chip.

* * * * *